(12) United States Patent
Ringstad

(10) Patent No.: US 12,414,265 B2
(45) Date of Patent: Sep. 9, 2025

(54) COMMON RAIL COOLING PLATE

(71) Applicant: Cummins Inc., Columbus, IN (US)

(72) Inventor: John Ringstad, Oregon, WI (US)

(73) Assignee: Cummins Inc., Columbus, IN (US)

(*) Notice: Subject to any disclaimer, the term of this patent is extended or adjusted under 35 U.S.C. 154(b) by 259 days.

(21) Appl. No.: 18/091,075

(22) Filed: Dec. 29, 2022

(65) Prior Publication Data
US 2024/0224465 A1    Jul. 4, 2024

(51) Int. Cl.
H05K 7/20     (2006.01)
H01L 23/473   (2006.01)

(52) U.S. Cl.
CPC ....... H05K 7/20272 (2013.01); H01L 23/473 (2013.01); H05K 7/20254 (2013.01); H05K 7/20927 (2013.01)

(58) Field of Classification Search
CPC ............... H05K 7/20254; H05K 7/20272
See application file for complete search history.

(56) References Cited

U.S. PATENT DOCUMENTS

| | | | | |
|---|---|---|---|---|
| 5,218,516 A * | 6/1993 | Collins | ............ | H05K 7/20545 361/721 |
| 5,276,584 A * | 1/1994 | Collins | ............ | H05K 7/20545 174/16.3 |
| 6,418,020 B1 * | 7/2002 | Lin | ............ | H01L 23/367 174/16.3 |
| 6,736,195 B2 * | 5/2004 | Busch | ............ | F28F 3/02 165/185 |
| 7,515,418 B2 * | 4/2009 | Straznicky | ............ | H01L 23/4338 361/699 |
| D678,852 S * | 3/2013 | Marshall | ............ | D13/179 |
| 8,844,609 B2 * | 9/2014 | Byers | ............ | F28D 15/0275 165/80.4 |
| 10,674,628 B2 * | 6/2020 | Moison | ............ | H05K 7/20281 |
| 11,412,640 B2 * | 8/2022 | Tomescu | ............ | H05K 7/20272 |
| 11,414,202 B2 * | 8/2022 | Tomescu | ............ | H05K 7/20254 |
| 11,644,254 B2 * | 5/2023 | Klaba | ............ | F28F 13/06 165/104.31 |
| D1,004,541 S * | 11/2023 | Bos | ............ | D13/107 |
| 12,082,369 B2 * | 9/2024 | Tamura | ............ | F28F 13/12 |
| 2021/0321526 A1 * | 10/2021 | Kulkarni | ............ | H05K 5/06 |
| 2022/0316817 A1 * | 10/2022 | Lee | ............ | F28F 3/12 |
| 2022/0346270 A1 * | 10/2022 | Tamura | ............ | H05K 7/20254 |
| 2023/0232524 A1 * | 7/2023 | Tufty | ............ | H05K 7/20409 361/688 |

(Continued)

FOREIGN PATENT DOCUMENTS

CN     107275300 A     10/2017
CN     109348682 A  *   2/2019  ......... H05K 7/20218

(Continued)

Primary Examiner — Robert J Hoffberg
(74) Attorney, Agent, or Firm — Faegre Drinker Biddle & Reath LLP

(57) ABSTRACT

A cooling plate assembly to facilitate the cooling of electronic components, the cooling plate assembly including a cooling plate and a cooling chamber. The cooling chamber comprising a surface configured to receive a component to be cooled, a cooling chamber inlet, a common rail, a collection cavity, a plurality of cooling units fluidly coupled between the common rail and collection cavity, and a cooling chamber outlet fluidly coupled to the collection cavity.

19 Claims, 7 Drawing Sheets

(56) References Cited

U.S. PATENT DOCUMENTS

2024/0074099 A1* 2/2024 Bauduin ............ H05K 7/20254
2024/0206122 A1* 6/2024 Mohanta ............ H05K 7/20354

FOREIGN PATENT DOCUMENTS

| CN | 212381608 U | 1/2021 |
| TR | 201920634 A1 | 6/2021 |
| WO | 2015113832 A1 | 8/2015 |

* cited by examiner

COMMON RAIL COOLING PLATE

FIELD

The present disclosure relates generally to cooling plates for cooling electronic components, such as IGBT modules.

BACKGROUND

During the use of electronic systems, electronic components may release heat that can damage and affect the operationality of the system. Therefore, it is necessary to be able to dissipate the heat created by electronic components in an efficient manner. Known cooling systems may provide uneven cooling, allowing some components to be cooled while others continue to release heat into the electronic system. Uneven flow splits may cause uneven cooling since different pathways will receive different amounts of coolant. Furthermore, electronic components positioned closer to the coolant inlet may be exposed to lower temperature coolant than the electronic components positioned at the end of a cooling pathway due to the coolant absorbing the heat as it flows through the cooling pathway.

Referring initially to FIG. 1, a known cooling device 10 is shown. Cooling device 10 comprises a cooling plate 20 and cooling chamber 22. Cooling plate 20 includes a first surface 12 and a second surface 14. Cooling chamber 22 is adjacent to first surface 12. A plurality of electrical components or other heat-producing objects (not shown) are coupled to second surface 14, which is opposite of first surface 12. Cooling chamber 22 includes two mirrored cooling loops 30 and a coolant outflow cavity 60. The cooling loops 30 each comprise a cooling loop inlet 40, a passageway 42 defined by passageway, and a cooling loop outlet 50 that is fluidly coupled to the coolant outflow cavity 60.

Cooling loops 30 are continuous loops that run from loop inlet 40 to loop outlet 50. Coolant flows into loop inlet 40, through passageway 42 enclosed by passageway walls 44, and out loop outlet 50. While flowing through passageway 42, the coolant absorbs heat through first surface 12 from the electrical components coupled to second surface 14, thereby cooling the electrical components. Once the coolant flows out of loop outlet 50, the coolant is collected in coolant outflow cavity 60 before flowing out of cavity 60.

SUMMARY

The present disclosure provides a cooling device. In an embodiment, the cooling device comprises: a surface configured to receive a component to be cooled; a cooling chamber inlet; a common rail fluidly coupled to the cooling chamber inlet; a collection cavity; a plurality of cooling units, each cooling unit located adjacent to the surface and comprising a passageway fluidly coupled between the common rail and the collection cavity; and a cooling chamber outlet fluidly coupled to the collection cavity. In some embodiments, the common rail is a central rail, and the plurality of cooling units are located on opposite sides of the central rail. In another embodiment, the common rail, plurality of cooling units and collection cavity are configured such that a pressure of a coolant fluid within the common rail is higher than a pressure of a coolant fluid within the collection cavity, and the coolant fluid flows into each of the plurality of cooling units at a generally equal velocity.

In various embodiments, the passageway is serpentine, optionally defined by adjacent linear segments connected by turns. In certain embodiments, each cooling unit further comprising a plurality of posts spaced apart from one another along a length of the passageway.

According to further embodiments, a common rail cooling device is provided. The common rail cooling device comprises: a first cooling plate, the first cooling plate comprising a first surface, and a second surface configured to receive one or more electronic components; a cooling chamber on the first surface of the cooling plate, the cooling chamber configured to receive cooling fluid and comprising: a common rail chamber; a collection cavity; and a plurality of cooling units including passageways fluidly coupled between the common rail and the collection cavity. In some embodiments, the common rail cooling device further comprises a second cooling plate opposite the cooling chamber from the first cooling plate, the second cooling plate including a first surface adjacent the cooling chamber and a second surface configured to receive one or more electronic components.

In certain embodiments, each of the one or more electronic components is located adjacent to a plurality of the cooling units. In further embodiments, each of the plurality of cooling units comprises a serpentine passageway. In other embodiments, the passageway of each cooling unit includes a plurality of segments, each of the plurality of segments coupled to the next segment in the plurality of segments by a turn.

In various embodiments, the plurality of cooling units are connected in a parallel fluid circuit between the common rail chamber and the collection cavity. In some embodiments, the common rail, plurality of cooling units and collection cavity are configured such that a pressure of a coolant fluid within the common rail is higher than a pressure of a coolant fluid within the collection cavity, and the coolant fluid flows into each of the plurality of cooling units at a generally equal velocity.

According to other embodiments, a cooling assembly is provided. The cooling assembly comprises a first member comprising: a first cooling plate, the first cooling plate including a first surface, and a second surface configured to receive one or more electronic component to be cooled; and a plurality of wall segments extending from the first surface, the wall segments defining a common rail cavity portion, a collection cavity portion, and a plurality of cooling unit passageway portions between the common rail cavity portion and the collection cavity portion; and a second member coupled to the first member, comprising: a second cooling plate, the second cooling plate including a first surface, and a second surface configured to receive one or more electronic components to be cooled; and a plurality of wall segments extending from the first surface, the wall segments defining a common rail cavity portion, a collection cavity portion, and a plurality of cooling unit passageway portions between the common rail cavity portion and the collection cavity portion; wherein when the first member and the second member are coupled, the wall segments of the first member are coupled to the wall segments of the second member to define a common rail cavity, a collection cavity, and a plurality of cooling unit passageways between the common rail cavity and the collection cavity.

According to further embodiments, the first member and the second member each comprise: wall segments defining a cooling chamber inlet portion coupled to the common rail portion; and wall segments defining a cooling chamber outlet portion coupled to the collection cavity portion; wherein when the first member and the second member are coupled, the wall segments define a cooling chamber inlet and a cooling chamber outlet. In certain embodiments, the plurality of cooling unit passageway portions of the first member and the plurality of cooling unit passageway portions of the second member each are configured such that a pressure of a coolant fluid within the common rail is higher than a pressure of a coolant fluid within the collection cavity, and the coolant fluid flows into each of the plurality of cooling units at a generally equal velocity.

In certain embodiments, the plurality of wall segments of the first member and the plurality of wall segments of the second member each define a serpentine plurality of cooling unit passageway portions connected by turns. In another embodiment, the plurality of cooling unit passageway portions of the first member and the plurality of cooling unit passageway portions of the second member each comprise a plurality of posts spaced apart from one another along a length of the plurality of cooling unit passageway portions.

In various embodiments, the first member and the second member are coupled, the plurality of posts of the first member and the plurality of posts of the second member are spaced apart by a distance. In another embodiment, the one or more electronic component to be cooled on the first cooling plate is located adjacent to the plurality of cooling unit passageway portions of the first cooling plate, and the one or more electronic component to be cooled on the second cooling plate is located adjacent to the plurality of cooling unit passageway portions of the second cooling plate. In certain embodiments, the plurality of cooling unit passageway portions of the first cooling plate is connected in a parallel fluid circuit between the common rail portion and the collection cavity portion, and the plurality of cooling unit passageway portions of the second cooling plate is connected in a parallel fluid circuit between the common rail portion and the collection cavity portion.

BRIEF DESCRIPTION OF THE DRAWINGS

The above-mentioned and other features and advantages of this disclosure, and the manner of obtaining them, will become more apparent, and will be better understood by reference to the following description of the exemplary embodiments taken in conjunction with the accompanying drawings, wherein.

Figure 1:
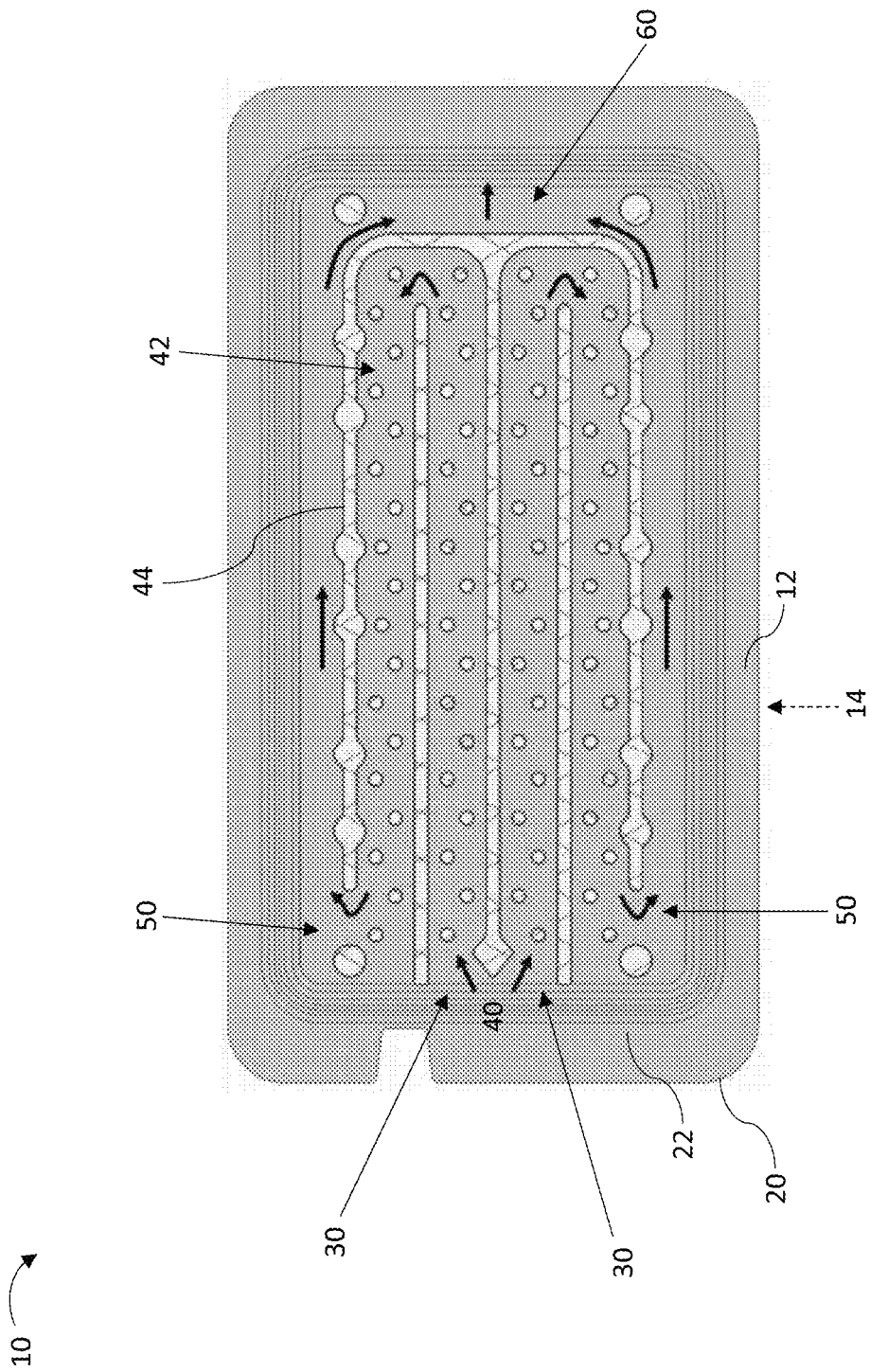
FIG. 1 is a top view of a known cooling assembly coupled to a cooling plate.

Corresponding reference characters indicate corresponding parts throughout the several views. Although the drawings represent embodiments of various features and components according to the present disclosure, the drawings are not necessarily to scale and certain features may be exaggerated in order to better illustrate and explain the present disclosure. The exemplification set out herein illustrates an embodiment of the invention, and such an exemplification is not to be construed as limiting the scope of the invention in any manner.

DETAILED DESCRIPTION

For the purposes of promoting an understanding of the principles of the present disclosure, reference is now made to the embodiments illustrated in the drawings, which are described below. The exemplary embodiments disclosed herein are not intended to be exhaustive or to limit the disclosure to the precise form disclosed in the following detailed description. Rather, these exemplary embodiments were chosen and described so that others skilled in the art may utilize their teachings.

To dissipate unwanted heat from an electronic system, cooling plates may be used. Cooling plates can have a coolant or other heat absorbing material that is run through a cooling assembly that is in close proximity to heat emitting components of the electronic system. The coolant absorbs the heat from components such that the electronic system is cooled. The configuration of the cooling assembly and cooling plates may affect the efficacy of the cooling.

Figure 2:
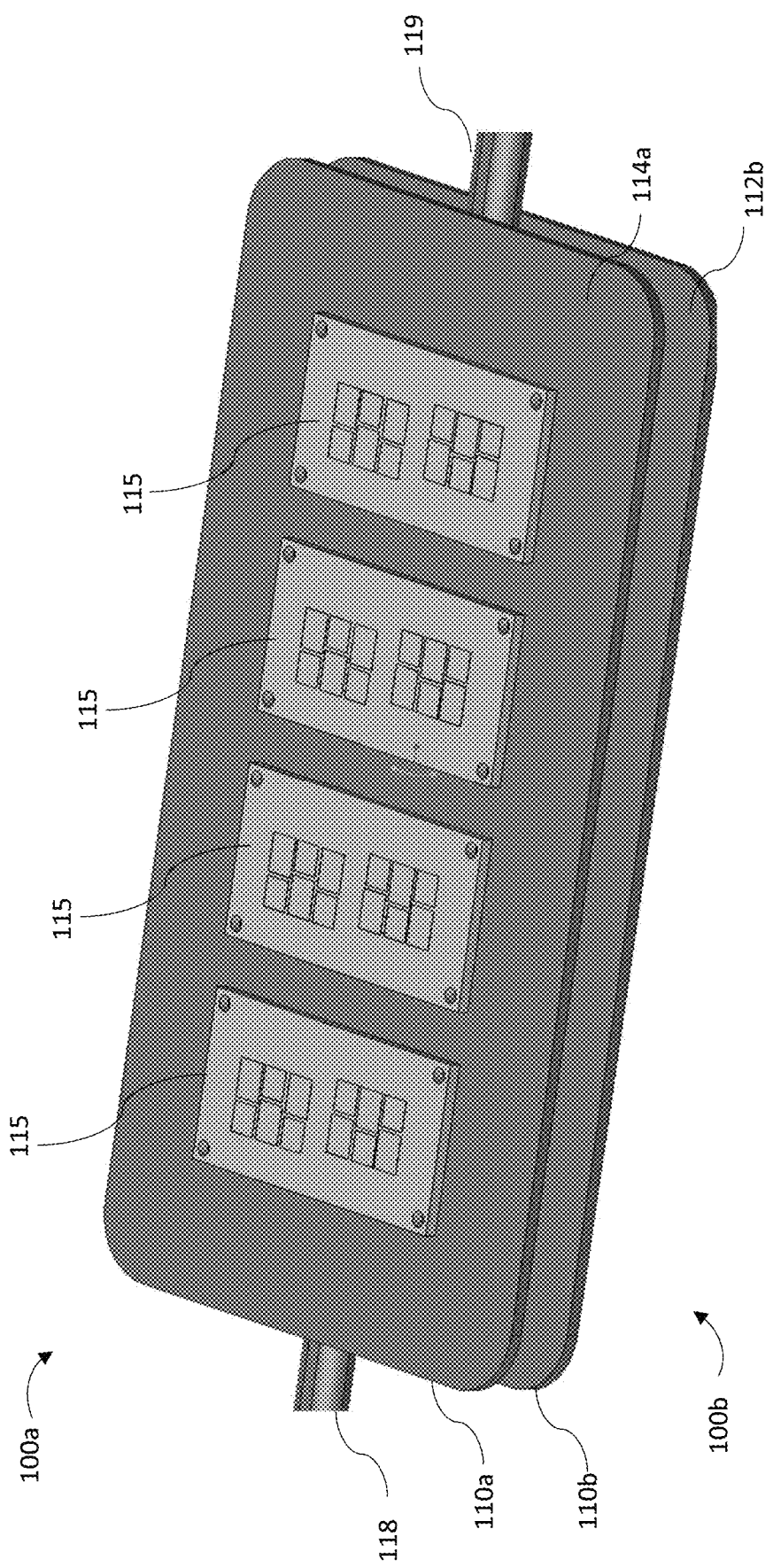
FIG. 2 is a perspective view of two cooling assemblies including two cooling plates, and IGBT modules coupled to the cooling plates.
Figure 3:
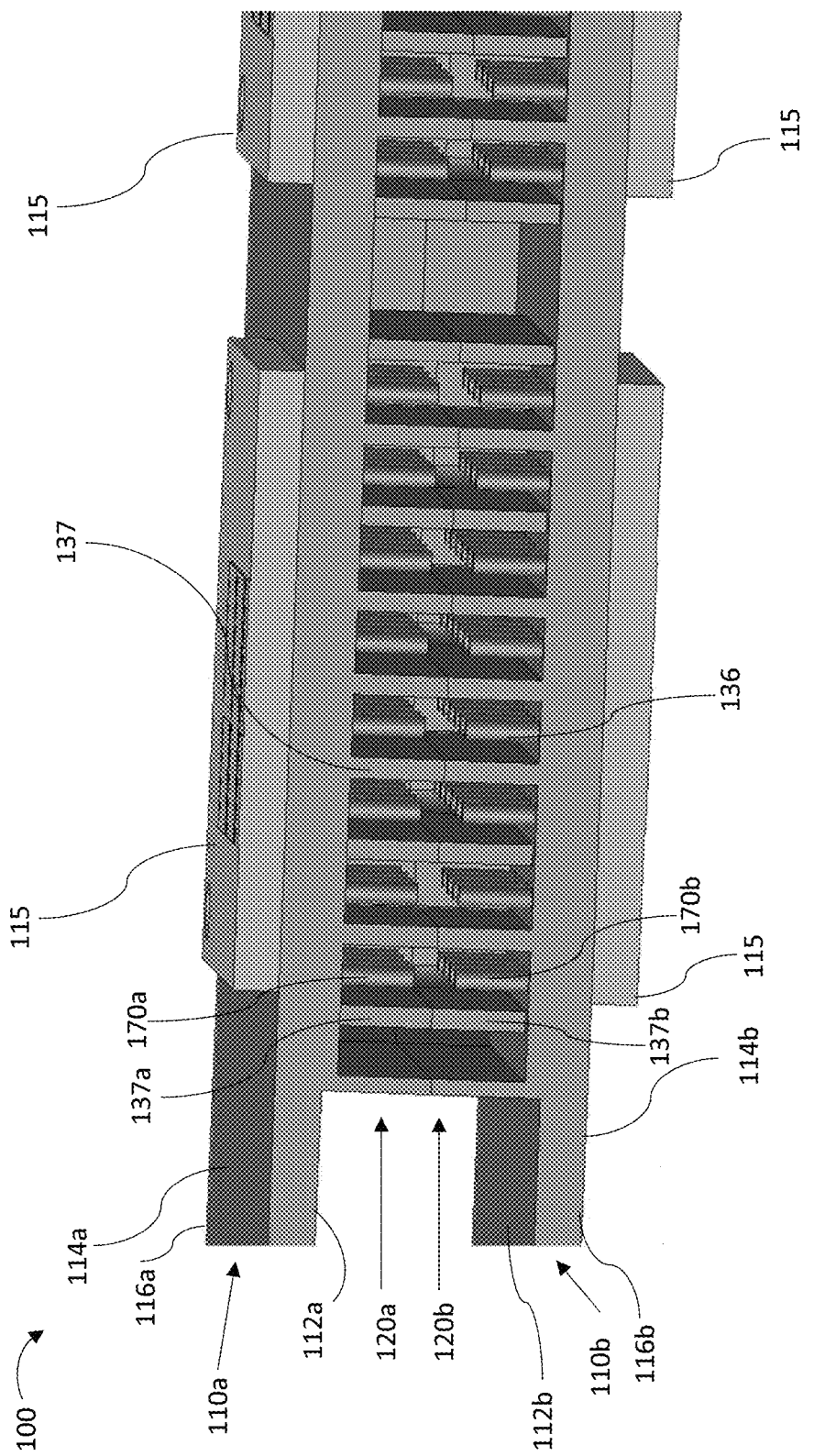
FIG. 3 is a cross-sectional side view of the cooling assemblies and corresponding cooling plates of FIG. 2.
Figure 4:
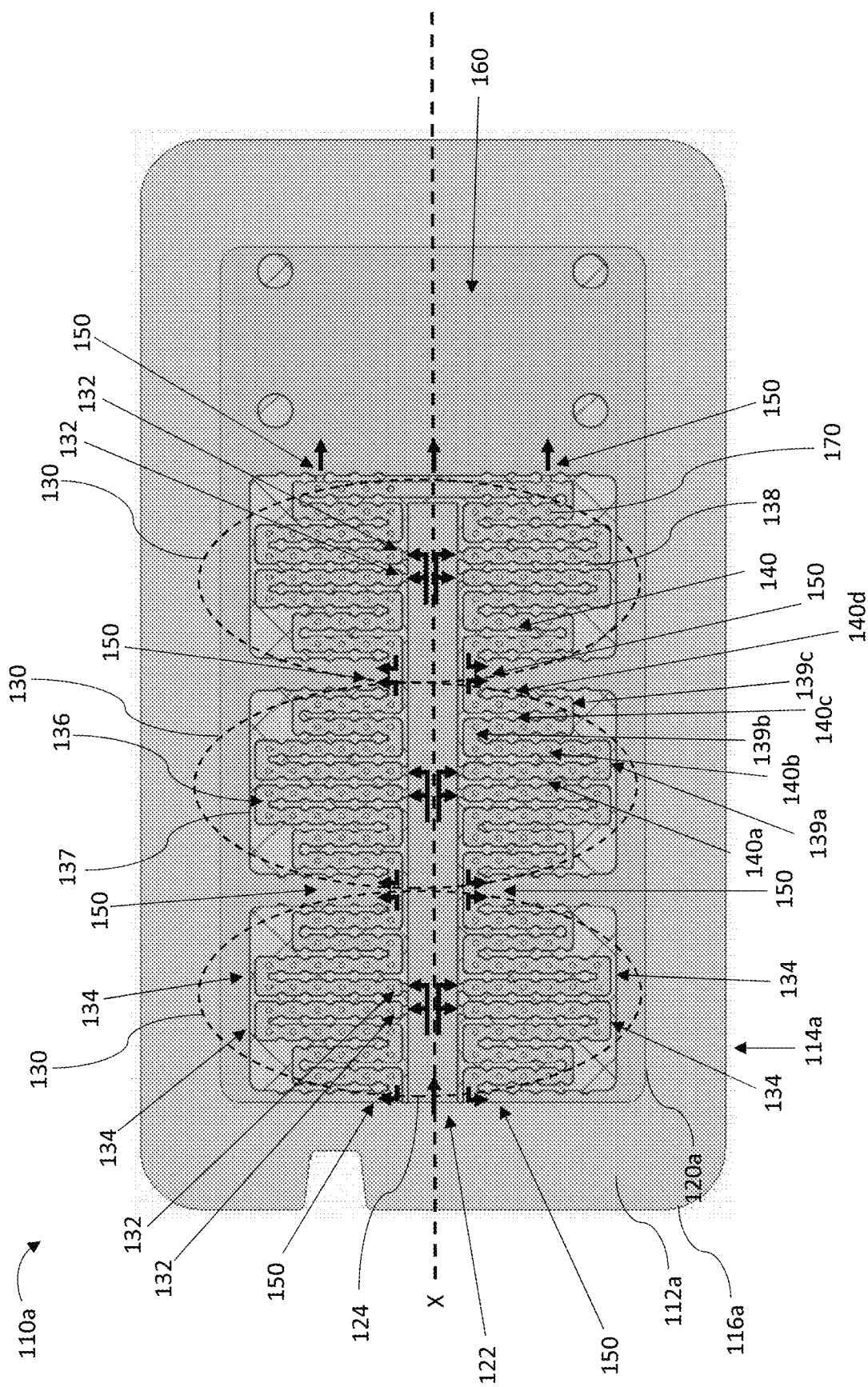
FIG. 4 is a cross-sectional view of one cooling assembly of FIG. 2, showing an interior first surface of the cooling plate.

As seen in FIGS. 2-4, a cooling assembly 100 of the present disclosure is illustrated. The cooling assembly 100 may comprise two cooling devices 110a, 110b. Each cooling device 110 may comprise a plate 116a, 116b and a cooling chamber 120a, 120b. First cooling plate 116a has a first surface 112a (FIG. 3) and a second surface 114a. Similarly, second cooling plate 116b has a first surface 112b and a second surface 114b. Cooling assembly 100 may be used to cool a plurality of electronic devices by coupling electronic devices to cooling devices 110a and 110b. Cooling devices 110a and 110b may also be used individually to cool electronic devices. To cool electronic devices 115 using cooling assembly 100, first cooling device 110a and second cooling device 110b may be positioned such that first surface 112a of first cooling plate 116a faces first surface 112b of second cooling plate 116b. As shown in FIG. 3, passageway walls 137 of cooling units 130 of cooling chambers 120 abut each other such that cooling chambers 120a and 120b share their respective voids and passageways 136 as described further herein.

A plurality of electronic components 115 may be removably coupled to the one or both of the second surfaces 114a, 114b. Electronic components 115 may include components such as IGBT power modules. In other embodiments, rather than electronic components, another heat source may be coupled to second surface 114. Each electronic component 115 may be equally spaced apart across second surface 114a and/or second surface 114b, unequally spaced apart across second surface 114a and/or second surface 114b, or positioned immediately adjacent to one another. Each electronic component 115 may correspond with a cooling unit 130 (FIG. 4) as described further herein.

While FIG. 2 illustrates four electrical components 115 coupled to each cooling plate 116a, 116b, other embodiments may include a greater or smaller number of electrical components. For example, other embodiments may include one, two, three, five, six, seven, eight, nine, or ten electrical components. In yet other embodiments, more than ten electrical components may be included. To increase or decrease the number of electrical components 115, each of the cooling plates 116 are increased or decreased in length and a greater or lesser number of corresponding cooling units 130 (FIG. 4) are included so that each electrical component corresponds to a cooling unit 130 (FIG. 4) as described further herein.

Referring to FIG. 4, cooling device 110a is illustrated. Cooling chamber 120a may be adjacent to first face 112a of cooling plate 116a. Because cooling chamber 120b may be substantially similar to cooling chamber 120a, descriptions of cooling chamber 120a may also describe cooling chamber 120b. Cooling chamber 120a may comprise a cooling chamber inlet 122, a common rail 124, a plurality of cooling units 130, and a collection cavity 160.

Axis X divides cooling chamber 120a into two parts down the length of cooling chamber 120a such that axis X runs through cooling inlet 122 and collection cavity 160. The cooling chamber 120a may be generally mirrored across axis X. Primary input port 118 may be fluidly coupled to a cooling chamber inlet 122 to allow a coolant fluid to flow into cooling chamber 120. Cooling chamber inlet 122 may supply the coolant fluid from primary input port 118 to the cooling chamber 120a. Cooling inlet 122 is sized and shaped to have a width that is larger than outlets 150 of the cooling units, discussed below. Once coolant passes through cooling chamber inlet 122, the coolant enters a common rail 124. Common rail 124 may be a straight pathway that extends along axis X through the center of the cooling chamber. In other embodiments, common rail 124 may be a curved pathway, an angled pathway, or another pathway which allows for pressured flow through common rail 124 and into cooling units 130 as described further herein.

Spaced along common rail 124 are a plurality of cooling units 130, so that each cooling unit 130 corresponds with an electrical component 115 as described further herein. Each cooling unit of the plurality of cooling units may be structurally similar. Descriptions of one cooling unit may apply to other cooling units in the plurality of cooling units. Cooling unit 130 comprises loop inlets 132, cooling loops 134, and loop outlets 150. Cooling unit 130 may be sized and shaped to correspond with the size and shape of an electrical component 115 coupled to second side 114a. In some embodiments, there may be one cooling unit 130 arranged on first side 112a for each, minus one, electrical component 115 coupled to second side 114a, wherein the final electrical component 115 may be coupled to second side 114a opposite of collection cavity 160. Similarly, there may be one cooling unit 130 arranged on first side 112b for each, minus one, electrical component 115 coupled to second side 114b, wherein the final electrical component 115 may be coupled to second side 114b opposite of collection cavity 160. In other embodiments, there is one cooling unit 130 on first side 112a for each electrical component 115 coupled to second side 114a. Similarly, there may be one cooling unit 130 on a first side 112b for each electrical component 115 coupled to second side 112b. Each cooling unit 130 may be located directly opposite an electrical component 115 such that coolant within cooling unit 130 may absorb heat from the corresponding electrical component 115.

Common rail 124 may run through the center of each cooling unit 130. Cooling unit 130 may include a plurality of loop inlets 132 and cooling loops 134. Each cooling loop 134 corresponds with a loop inlet 132. Coolant from common rail 124 flows through each of the loop inlets 132 and into the cooling loops 134. Cooling unit 130 may be generally bisected by common rail 124. Loop inlets 132 are fluidly connected and spaced apart on either side of common rail 124. In one embodiment, as seen in FIG. 4, each cooling unit 130 may include four cooling loops 134. A first pair of cooling loops may be positioned on one side of common rail 124 and a second pair of cooling loops may be mirrored on the other side of common rail 124 opposite of the first two cooling loops. Loop inlets 132 may be positioned such that they are located on common rail 124 on first surface 112a opposite a middle region of corresponding electrical component 115 positioned on second surface 114a. Referring to the previous embodiment, four loop inlets 132 may be spaced apart along common rail 124 on first surface 112a opposite the middle region of electric component 115 such that a first pair of loop inlets 132 oppose a second pair of loop inlets 132 across common rail 124.

Each cooling loop 134 may be connected in parallel along common rail 124. Cooling loop 134 begins at loop inlet 132 and ends at loop outlet 150. A passageway 136 extends from loop inlet 132 to loop outlet 150 and is defined by passageway walls 137. Coolant may flow down common rail 124 and enter each loop inlet 132 substantially simultaneously. Once coolant enters into cooling loop 134, coolant then travels through passageway 136. Passageway walls 137 may be sized and shaped to allow coolant to flow through passageway 136 such that a surface area of passageway 136 is completely immersed in coolant fluid. Passageway walls 137 may comprise a plurality of nubs 138 to facilitate turbulent flow of coolant through passageway 136 and increase surface area of passageway walls 137. Similarly, a plurality of posts 170 may be spaced within passageway 136 spaced apart from passageway walls 137 to further facilitate turbulent flow of the coolant by interrupting flow. Turbulence in the coolant fluid may allow the coolant to absorb more heat from electronic components 115 by allowing even distribution of heat to the coolant.

As shown in FIG. 3, passageway walls 137 have a first height and posts 170 have a second height less than the first height. When first cooling device 110a and second cooling device 110b abut each other, as shown in FIG. 3, the passageway walls 137a of first cooling plate 116a abut the passageway walls 137b of second cooling plate 116b to form enclosed passageway 136, while posts 170a and 170b do not touch to further facilitate turbulence within passageway 136.

Passageway 136 may include a plurality of passageway segments 140 of various lengths. Each passageway segment 140 is coupled by a turn 139. Passageway segments 140 may be positioned such that passageway 136 is serpentine and directs coolant back and forth across first surface 112a. In one embodiment, cooling loop 134 may include a passageway that comprises four serpentine passageway segments 140a, 140b, 140c, 140d coupled by three turns 139a, 139b, 139c. Turns 139 guide coolant flowing through each passageway segment 140 of passageway 136 back and forth on a portion of first surface 112a that corresponds to a portion of electronic component 115 coupled to second surface 114a. For example, each cooling loop 134 and its corresponding passageway 136 may, together with a portion of the common rail 124, correspond generally with a quarter of corresponding electronic component 115. The plurality of turns within passageway 136 facilitates even flow of the coolant within a compact corresponding section of the electronic component 115 and focuses flow of the coolant to allow for even heat distribution and efficiency.

At the end of turns 139, passageway 136 leads to loop outlet 150. Loop outlet 150 is fluidly coupled to passageway 136 and collection cavity 160. Coolant flows through cooling loop 134 via passageway 136 and exits loop outlet 150 into collection cavity 160. Loop outlets 150 are sized and shaped such that a width of loop outlet 150 is smaller than a width of coolant inlet 122. Due to the difference in width of the cooling inlet and the loop outlets, a pressure differential may be created, as discussed below.

Once the coolant exits cooling loop 134 through loop outlet 150, the coolant enters collection cavity 160. Collection cavity 160 may collect coolant that has run through cooling units 130, which then exits collection cavity 160. In some embodiments, an electronic component 115 may be positioned on second side 114 opposite collection cavity 160, which is positioned on first side 112. Coolant fluid may be drained from collection cavity 160 by primary output port or "cooling chamber outlet" 119. Primary output port 119 may direct the coolant fluid used to cool electronic components 115 to other systems.

In another embodiment, a common rail cooling device may comprise a first component 110a and a second component 110b configured to be coupled to first component 110a to form the common rail cooling device 100. The one or more of first component 110a and second component 110b may include an outer surface 114 configured to receive one or more electronic components 115 to be cooled. Further, one or more of first component 110a and second component 110b may include wall section 137, such that when the first and second components 110a, 110b are joined the wall sections 137 define within the common rail cooling device 100 a common rail cavity 124, a collection cavity 160, and a plurality of cooling units 130 adjacent to outer surface 114 configured to receive the one or more electronic components 115, and wherein each cooling unit 130 includes a passageway 136 fluidly coupled between the common rail cavity 124 and the collection cavity 160.

A method for operating cooling device 110 is described herein. Cooling device 110 may be used to cool one or more electronic components 115 on second surface 114 of cooling device 110. The method may include supplying coolant fluid to cooling chamber inlet 122, and causing the coolant fluid to flow into common rail 124, into and through the passageway 136 of each cooling unit 130, out of each cooling unit 130 into collection cavity 160, and out of cooling chamber 120 through cooling chamber outlet 119.

Figure 5:
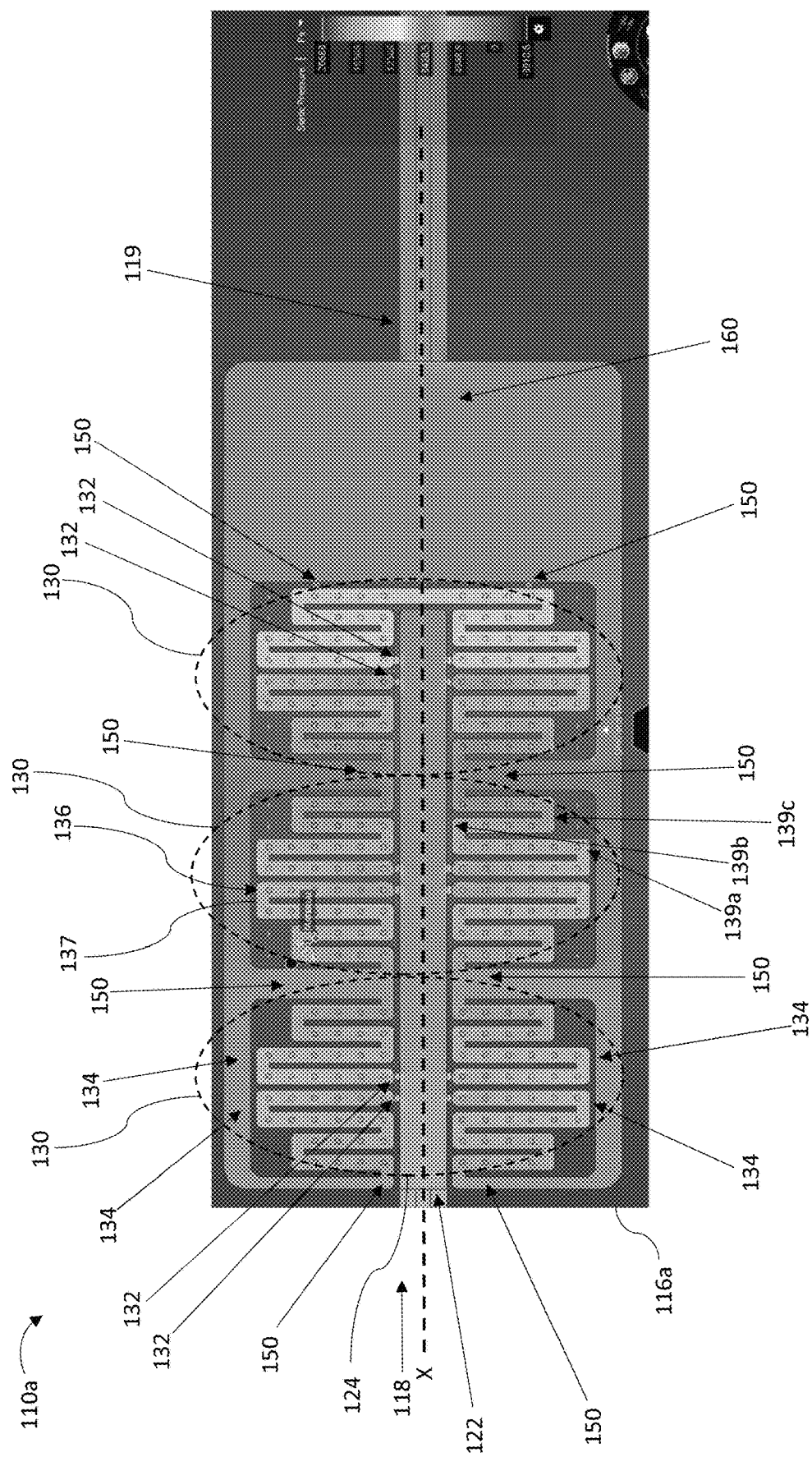
FIG. 5 is an exemplary image of fluid pressure within the cooling assembly of FIG. 4 during operation.
Figure 6:
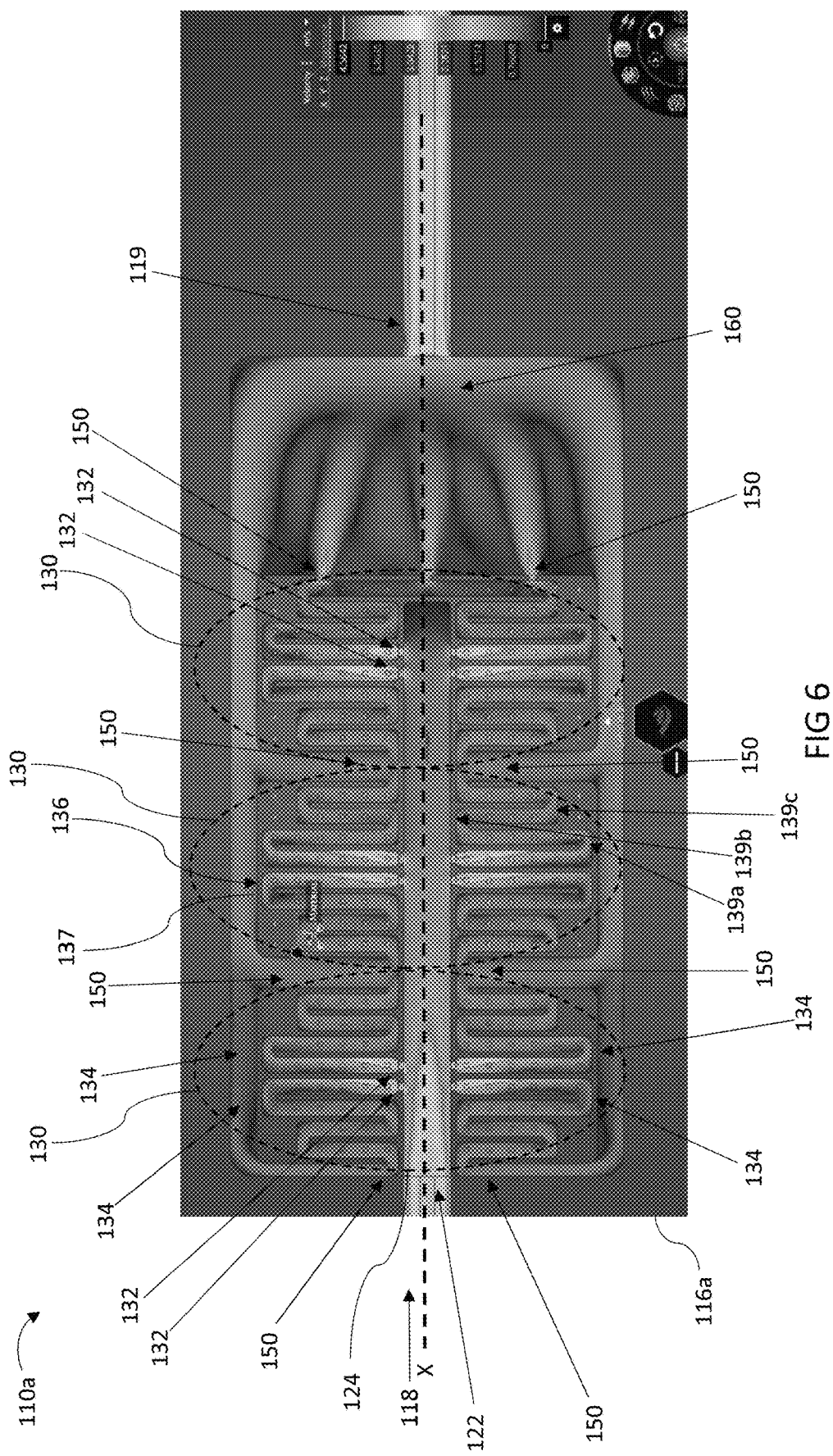
FIG. 6 is an exemplary image of fluid velocity within the cooling assembly of FIG. 4 during operation.

Referring to FIG. 5, the pressure of the coolant in collection cavity 160 may be lower than the pressure of coolant flowing into cooling inlet 122. Because of the pressure differential, coolant may be flowing at a much higher velocity through cooling inlet 122 into common rail 124 than coolant flowing into collection cavity from loop outlets 150. Further, the difference in pressure between the high pressure cooling inlet 122 and low pressure collection cavity 160 may allow an even flow split of coolant into the plurality of loop inlets 132 located along common rail 124. The high pressure coolant flowing in through cooling inlet 122 may cause the coolant to fill the common rail 124 quickly and evenly distribute coolant into loop inlets 134. In other words, referring additionally to FIG. 6, the high pressure within the common rail 124 causes the coolant to jet generally evenly into inlets 132 and corresponding cooling loops 134 at a high velocity. The even flow split of coolant may allow for each cooling unit 130 to receive the same amount of coolant to cool each corresponding electronic component 115. Because each electrical component may correspond to a cooling unit 130 with an equal amount of coolant flowing through it, each electrical component is able to dissipate the same amount of heat. The size of collection cavity 160 and cooling inlet 122 may be scaled to support a variety of electronic components while maintaining the pressure differential.

To better understand the description above, exemplary cooling assemblies 100a and 100b are described herein. As seen in FIGS. 2-4, cooling assembly 100 comprises a first cooling device 110a and a second cooling device 110b. Cooling devices 110a and 110b are substantially alike. First cooling device 110a includes first plate 116a and cooling chamber 120a. Similarly, second cooling device 110b includes second plate 116b and cooling chamber 120b. Each cooling plate 116a, 116b has a first surface 112a, 112b, and a second surface 114a, 114b. Removably coupled to each second surface 114a, 114b, are a series of electronic components 115, such as IGBT models. First surfaces 112a and 112b each comprise a cooling chamber 120a, 120b. Each cooling chamber is substantially alike. The first surface 112a of first cooling plate 116a and the first surface 112b of the second cooling plate 116b directly oppose each other such that cooling assemblies 120a, 120b are abutting. Referring to cooling device 110a in FIG. 4, cooling chamber 120a comprises a cooling inlet 122, a common rail 124, and three cooling units 130. Each cooling unit 130 corresponds with one electrical component 115. Each cooling unit 130 has four cooling loops 134 positioned such that a first pair of cooling loops are on one side of common rail 124 and a second pair of cooling loops are on the other side of common rail 124. Each cooling loop 134 is fluidly connected to common rail 124 by a loop inlet 132. Cooling inlets 132 are located on common rail 124 at a location on first surface 112a that is opposite the center of electronic component 115 coupled on second surface 114a. Each cooling loop, together with a portion of the common rail 124, corresponds generally with one quadrant of electronic component 115. High pressure coolant flows into common rail 124 from cooling inlet 122. Coolant then evenly splits off into each one of loop inlets 132. As coolant flows through loop inlets 132 into cooling loops 134, the coolant passes through passageways 136. Nubs 138 on passageway walls 137 and posts 170 within passageway 136 create turbulence in the coolant for even cooling as coolant flows through the three turns 139a, 139b, 139c of passageway 136. At the end of passageway 136, coolant exits cooling loop 132 through loop outlet 150 and enters the low-pressure collection cavity 160. Each of the electronic components 115 are evenly cooled by the cooling chamber 120a on first surface 112a. Similarly, cooling device 110b has a cooling chamber 120b to cool the electronic components on second surface 114b of cooling plate 116b.

EXAMPLE

Figure 7:
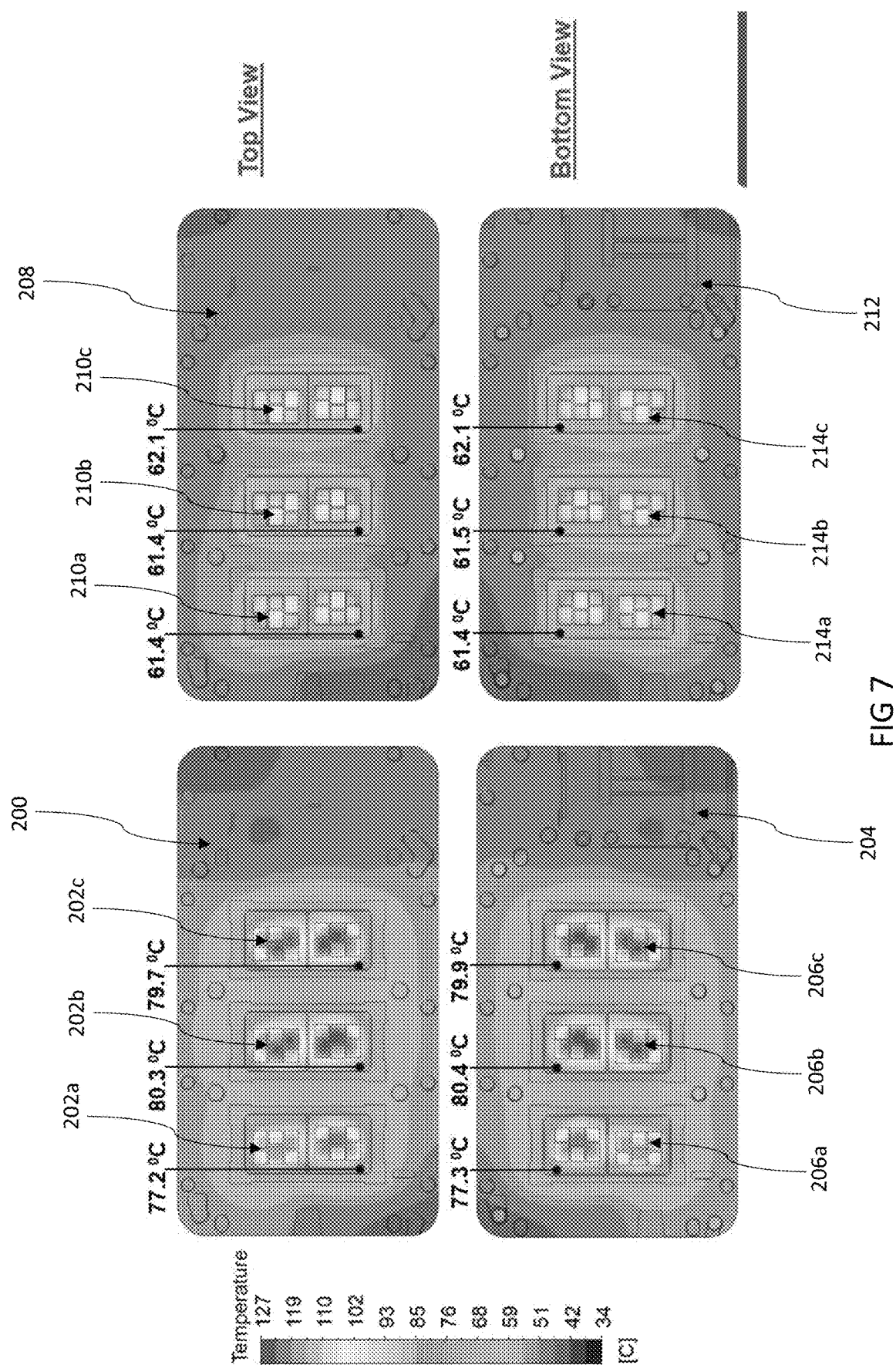
FIG. 7 illustrates a thermal comparison between the cooling assemblies of the present disclosure and the cooling assembly of FIG. 1.

FIG. 7 illustrates the thermal difference demonstrated between a conventional cooling device and cooling device 110 (FIGS. 2-4) during a testing simulation. Cooling plate 200 corresponds with a first cooling plate 20 of cooling device 10, wherein cooling plate 200 includes a plurality of electronic components 202. Cooling plate 204 corresponds with a second cooling plate similar to cooling plate 20 of cooling device 10, wherein cooling plate 204 includes a plurality of electronic components 206. Cooling plate 208 corresponds with first cooling plate 116a of cooling device 110a, wherein cooling plate 208 includes a plurality of electronic components 210. Cooling plate 212 corresponds with second cooling plate 110b of cooling device 110b, wherein cooling plate 212 includes a plurality of electronic components 214.

As shown, electronic component 202a of cooling plate 200 demonstrated an average temperature of 77.2° C., electronic component 202b demonstrated an average temperature of 80.3° C., and electronic component 202c demonstrated an average temperature of 79.7° C. The average temperature of electronic components 202 was 79.1° C.

Electronic component 206a of cooling plate 204 demonstrated an average temperature of 77.3° C., electronic component 206b demonstrated an average temperature of 80.4° C., and electronic component 206c demonstrated an average temperature of 79.9° C. The average temperature of electronic components 206 was 79.2° C.

Electronic component 210a of cooling plate 208 demonstrated an average temperature of 61.4° C., electronic component 210b demonstrated an average temperature of 61.4° C., and electronic component 210c demonstrated an average temperature of 62.1° C. The average temperature of electronic components 210 was 61.6° C.

Electronic component 214a of cooling plate 212 demonstrated an average temperature of 61.4° C., electronic component 214b demonstrated an average temperature of 61.5° C., and electronic component 214c demonstrated an average temperature of 62.1° C. The average temperature of electronic components 214 was 61.7° C.

The average temperature of the electronic components of the cooling assembly corresponding to conventional cooling assembly 10 was 79.1° C. The average temperature of the electronic components of the cooling assembly 100 was 61.7° C. As such, cooling assemblies 100a and 100b demonstrated a temperature difference of 17.4° C. compared to the conventional cooling assembly.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practices in the art to which this invention pertains.

What is claimed is:

1. A cooling device, comprising:
   a surface configured to receive a component to be cooled;
   a cooling chamber inlet;
   a common central rail fluidly coupled to the cooling chamber inlet;
   a collection cavity;
   a plurality of cooling units, fluidly coupled to the common central rail such that each of the plurality of cooling units extends and is fed from both opposite sides of the common central rail and the common central rail bisects each of the plurality of cooling units;
      wherein each cooling unit of the plurality of cooling units is located adjacent to the surface and comprises a passageway fluidly coupled to the common central rail and the collection cavity; and
      wherein the cooling device is configured for a coolant fluid to only flow sequentially from the common central rail, through the plurality of cooling units and to the collection cavity;
   a cooling chamber outlet fluidly coupled to the collection cavity.

2. The cooling device of claim 1, wherein the common central rail, the plurality of cooling units and the collection cavity are configured such that a pressure of the coolant fluid within the common central rail is higher than a pressure of the coolant fluid within the collection cavity, and the coolant fluid flows into each of the plurality of cooling units at an equal velocity.

3. The cooling device of claim 1, wherein the passageway is serpentine, and defined by adjacent linear segments connected by turns.

4. The cooling device of claim 1, wherein each cooling unit of the plurality of cooling units further comprises a plurality of posts spaced apart from one another along a length of the passageway.

5. A common rail cooling device comprising:
   a first cooling plate, the first cooling plate comprising a first surface, and a second surface configured to receive one or more first electronic components;
   a cooling chamber on the first surface of the first cooling plate, the cooling chamber configured to receive a coolant fluid and comprising:
      a common rail chamber;
      a collection cavity; and
      a plurality of cooling units including passageways fluidly coupled between the common rail chamber and the collection cavity;
         wherein the plurality of cooling units are fluidly coupled to the common rail chamber such that each of the plurality of cooling units extends and is fed from both opposite sides of the common rail chamber and the common rail chamber bisects each of the plurality of cooling units; and
         wherein the common rail cooling device is configured for the coolant fluid to only flow sequentially from the common rail chamber, through the plurality of cooling units and to the collection cavity.

6. The common rail cooling device of claim 5, further comprising a second cooling plate opposite the cooling chamber of the first cooling plate, the second cooling plate including a first surface of the second cooling plate facing the cooling chamber of the first cooling plate and a second surface of the second cooling plate configured to receive one or more second electronic components.

7. The common rail cooling device of claim 6, wherein the one or more second electronic components on the second cooling plate and the one or more first electronic components on the first cooling plate are located adjacent to the plurality of cooling units.

8. The common rail cooling device of claim 7, wherein the passageways of each cooling unit includes a plurality of segments, each of the plurality of segments coupled to the next segment in the plurality of segments by a turn.

9. The common rail cooling device of claim 5, wherein the passageways are serpentine passageways.

10. The common rail cooling device of claim 5, wherein the plurality of cooling units are connected in a parallel fluid circuit between the common rail chamber and the collection cavity.

11. The common rail cooling device of claim 5, wherein the common rail chamber, the plurality of cooling units and the collection cavity are configured such that a pressure of the coolant fluid within the common rail chamber is higher than a pressure of the coolant fluid within the collection cavity, and the coolant fluid flows into each of the plurality of cooling units at an equal velocity.

12. A cooling assembly, comprising:
   a first member comprising:
      a first cooling plate, the first cooling plate including a first surface of the first cooling plate, and a second surface of the first cooling plate configured to receive one or more first electronic components to be cooled; and
      a first plurality of wall segments extending from the first surface of the first cooling plate, the first plurality of wall segments defining a first common rail cavity portion, a first collection cavity portion, and a first plurality of cooling unit passageways between the first common rail cavity portion and the first collection cavity portion; and a second member coupled to the first member, comprising:

a second cooling plate, the second cooling plate including a first surface of the second cooling plate, and a second surface of the second cooling plate configured to receive one or more second electronic components to be cooled; and a second plurality of wall segments extending from the first surface of the second cooling plate, the second plurality of wall segments defining a second common rail cavity portion, a second collection cavity portion, and a second plurality of cooling unit passageways between the second common rail cavity portion and the second collection cavity portion;

wherein when the first member and the second member are coupled, the first plurality of wall segments are coupled to the second plurality of wall segments such that the first common rail cavity portion and the second common rail cavity portion form a common central rail, the first collection cavity portion and the second collection cavity portion form a collection cavity, and the first plurality of cooling unit passageways and the second plurality of cooling unit passageways form a plurality of cooling units between the common central rail and the collection cavity;

wherein the cooling assembly is configured for a coolant fluid to only flow sequentially from the common central rail, through the plurality of cooling units and to the collection cavity; and wherein the plurality of cooling units are fluidly coupled to the common central rail such that each of the plurality of cooling units extends and is fed from both opposite sides of the common central rail and the common central rail bisects each of the plurality of cooling units.

13. The cooling assembly of claim 12, wherein:

the first member comprises:

a first cooling chamber inlet portion coupled to the first common rail cavity portion; and a first plurality of loop outlet portions each coupled to the first plurality of cooling unit passageways and the first collection cavity portion; and the second member comprises:

a second cooling chamber inlet portion coupled to the second common rail cavity portion; and a second plurality of loop outlet portions coupled to the second plurality of cooling unit passageways and the second collection cavity portion;

wherein when the first member and the second member are coupled such that the first plurality of wall segments are joined to the second plurality of wall segments, the first cooling chamber inlet portion and the second cooling chamber inlet portion define a cooling chamber inlet and the first plurality of loop outlet portions and the second plurality of loop outlet portions define a plurality of loop outlets.

14. The cooling assembly of claim 12, wherein each of the first plurality of cooling unit passageways and each of the second plurality of cooling unit passageways are configured such that a pressure of the coolant fluid within the common central rail is higher than a pressure of the coolant fluid within the collection cavity, and the coolant fluid flows into each of the first plurality of cooling unit passageways and the second plurality of cooling unit passageways at an equal velocity.

15. The cooling assembly of claim 12, wherein each of the plurality of first cooling unit passageways is a serpentine passageway formed from the first plurality of wall segments connected by turns and each of the plurality of second cooling unit passageways is a serpentine passageway formed from the second plurality of wall segments connected by turns.

16. The cooling assembly of claim 12, wherein each of the first plurality of cooling unit passageways and each of the second plurality of cooling unit passageways comprise a plurality of posts spaced apart from one another along a length of each of the first plurality of cooling unit passageways and each of the second plurality of cooling unit passageways.

17. The cooling assembly of claim 16, wherein when the first member and the second member are coupled, the plurality of posts of the first member is spaced apart from a corresponding one of the plurality of posts of the second member by a distance.

18. The cooling assembly of claim 12, wherein the one or more first electronic components to be cooled on the first cooling plate is located adjacent to the first plurality of cooling unit passageways, and the one or more second electronic components to be cooled on the second cooling plate is located adjacent to the second plurality of cooling unit passageways.

19. The cooling assembly of claim 12, wherein the first plurality of cooling unit passageways is connected in a parallel fluid circuit between the first common rail cavity portion and the first collection cavity portion, and the second plurality of cooling unit passageways is connected in a parallel fluid circuit between the second common rail cavity portion and the second collection cavity portion.

* * * * *